(12) United States Patent
Yoshinaga (10) Patent No.: US 7,190,433 B2
(45) Date of Patent: Mar. 13, 2007

(54) APPARATUS AND METHOD OF EXPOSING A SEMICONDUCTOR DEVICE HAVING A CURVED SURFACE TO LIGHT

(75) Inventor: Junichi Yoshinaga, Tokyo (JP)

(73) Assignee: Yamatake Corporation, Tokyo (JP)

( * ) Notice: Subject to any disclaimer, the term of this patent is extended or adjusted under 35 U.S.C. 154(b) by 29 days.

(21) Appl. No.: 10/538,979

(22) PCT Filed: Jan. 9, 2003

(86) PCT No.: PCT/US03/00567

§ 371 (c)(1),
(2), (4) Date: Jun. 14, 2005

(87) PCT Pub. No.: WO2004/063812

PCT Pub. Date: Jul. 29, 2004

(65) Prior Publication Data

US 2006/0051979 A1    Mar. 9, 2006

(51) Int. Cl.
*G03B 27/58* (2006.01)
*G03B 27/32* (2006.01)
*G03C 5/00* (2006.01)

(52) U.S. Cl. .............................. 355/47; 355/72; 355/77; 430/311

(58) Field of Classification Search .................. 355/47, 355/48, 49, 53, 67, 72, 77; 430/5, 311; 700/121
See application file for complete search history.

(56) References Cited

U.S. PATENT DOCUMENTS

| | | |
|---|---|---|
| 5,436,692 A | 7/1995 | Noguchi |
| 5,476,736 A | 12/1995 | Tanabe |
| 5,955,776 A | 9/1999 | Ishikawa |
| 6,061,118 A | 5/2000 | Takeda |
| 6,069,682 A | 5/2000 | Ishikawa |
| 6,097,472 A | 8/2000 | Tanaka et al. |
| 6,130,742 A | 10/2000 | Kanatake |
| 6,136,479 A | 10/2000 | Yamaguchi |
| 6,136,617 A | 10/2000 | Kanatake et al. |
| 6,245,630 B1 | 6/2001 | Ishikawa |
| 6,251,550 B1 | 6/2001 | Ishikawa |
| 6,251,765 B1 | 6/2001 | Fukano et al. |
| 6,262,791 B1 | 7/2001 | Powell |
| 6,265,234 B1 | 7/2001 | Mei |
| 6,300,020 B1 | 10/2001 | Ina et al. |
| 6,304,316 B1 | 10/2001 | Jain et al. |

(Continued)

*Primary Examiner*—Alan Mathews
(74) *Attorney, Agent, or Firm*—Robert D. Atkins; Quarles & Brady LLP (57) ABSTRACT

A semiconductor manufacturing station (50) exposes light on a surface area of a spherical semiconductor device or ball (52). A mask (56) receives light from a light source (54) and passing the light to the surface area of the semiconductor ball according to a pattern of the mask. A lens (62) is positioned between the mask and the semiconductor ball such that a focal distance between the lens and the ball is variable to focus the light passed by the pattern of the mask on surface areas of the object. The pattern of the mask is made a series of concentric circles or rings (74–80) to focus light on desired surfaces of the semiconductor ball. The manufacturing system can be a plurality of optical stations (104–110) each configured to expose a circle or ring on the surface of the semiconductor ball as it passes in proximity to the plurality of optical stations.

30 Claims, 3 Drawing Sheets

U.S. PATENT DOCUMENTS 6,304,317 B1    10/2001   Taniguchi et al.
6,416,908 B1 *   7/2002   Klosner et al. ................ 430/5
6,529,262 B1     3/2003   Mei et al.
6,707,534 B2 *   3/2004   Bjorklund et al. ............ 355/53

* cited by examiner

APPARATUS AND METHOD OF EXPOSING A SEMICONDUCTOR DEVICE HAVING A CURVED SURFACE TO LIGHT

This application is a U.S. National Stage Application filed under 35 U.S.C. 371 claiming priority from the International Application No. PCT/US2003/000567, filed Jan. 9, 2003, which application is incorporated herein by reference.

FIELD OF THE INVENTION

The present invention relates in general to semiconductor manufacturing equipment and processes and, more particularly, to an apparatus and method of exposing a light source to a semiconductor device having a curved surface.

BACKGROUND OF THE INVENTION

Semiconductor devices are commonly used in many types of electronic products. The manufacturing of a semiconductor device typically involves growing a cylindrical-shaped silicon (or other base semiconductive material) ingot. The ingot is sliced into circular flat wafers. Through a number of thermal, chemical, and physical processes, including diffusion, oxidation, epitaxial growth, ion implantation, deposition, etching, sputtering, polishing, and cleaning, active semiconductor devices and passive devices are formed on one or both surfaces of the wafer. The wafer is cut into individual rectangular semiconductor die which are then mounted and attached to a leadframe, encapsulated, and packaged as discrete or integrated circuits. The packaged discrete and integrated circuits are mounted to a printed circuit board and interconnected to perform the desired electrical function.

Another type of semiconductor device, known as a spherical-shaped semiconductor device or ball, has emerged in the industry to offer a number of advantages over flat semiconductor wafers and rectangular semiconductor die. The manufacture of the semiconductor ball is disclosed in U.S. Pat. No. 5,955,776. The semiconductor ball is manufactured using less complex and less expensive equipment as compared to wafer-type semiconductor manufacturing. The physical characteristics of the semiconductor ball provides for easy transport through pipes and tubes filled with a gaseous or fluid medium, which reduces the need for expensive, large scale, open clean rooms. The enclosed transport reduces the potential for exposure to contaminants, which reduces defects and increases the production yield.

A typical semiconductor ball has a diameter of about 1.0 millimeters (mm) or less and may contain active semiconductor devices and passive devices over virtually its entire surface area. The spherical shape increases both the useable area of the semiconductor device and the device integration density for a given footprint. The semiconductor ball may interconnect to a printed circuit board, or to other semiconductor balls, at any location on its surface thereby reducing, simplifying, and adding flexibility to the interconnect layout. The flexible interconnect allows for three dimensional clustering of the semiconductor balls each having multiple active layers and multiple metal layers in any direction. The spherical shape of the semiconductor ball provides structural strength and integrity such that conventional assembly and packaging become unnecessary in some applications.

The semiconductor ball undergoes a variety of conventional thermal, chemical, and physical processing steps during manufacture. Several of the processing steps involve exposure of the semiconductor ball to a light source. For example, an etching process to selectively remove semiconductor material involves application of a photoresist material to a surface area. A mask is positioned above the surface area and exposed to a light source. The pattern in the mask either blocks the light or allows it to pass to the semiconductor surface area. Accordingly, portions of the surface area of the semiconductor ball are exposed to the light according to the mask pattern. The photoresist on those portions of the surface area that are exposed to light is polymerized. The photoresist on those portions of the surface area that are not exposed to light is not polymerized. The mask is removed and the photoresist is developed to remove the non-polymerized photoresist. A solution of nitric and hydrofluoric (HF) acid is applied the surface area to etch away the material which had been under the non-polymerized photoresist. The polymerized photoresist and the underlying material remain. The photoresist etch process may also be configured to operate in the opposite mode.

For conventional semiconductor wafers, the light exposure incident to its flat surface is relatively uniform and even. On the other hand, the exposure of light to a curved surface such as found on a spherical semiconductor ball presents a number of challenges to the manufacturing process. In general, it is impractical to cover the entire surface of the semiconductor ball with one mask pattern. Moreover, it is difficult to focus the light uniformly over a significant portion of the curved surface of a spherical body. If the focus of the light source is directed to one focal point on the curved surface, then the rest of the pattern image diminishes, blurs, or distorts on the curved surface moving away from the focal point. The exposure of light to a curved surface results in a non-uniform distribution of the light and non-uniform focus and clarity of the projected image radially from the focal point. In addition, the light incident to the focal point on the curved surface normal to the direction of the light path will have a stronger intensity than a second point on the curved surface some distance from the focal point. The light striking the second point will have an angle of incidence less than 90 degrees and consequently a lower intensity. In the etching process, the photoresist on the surface area exposed to a lower intensity light will develop at a different rate than the photoresist on the surface area exposed to a higher intensity light.

Figure 1:
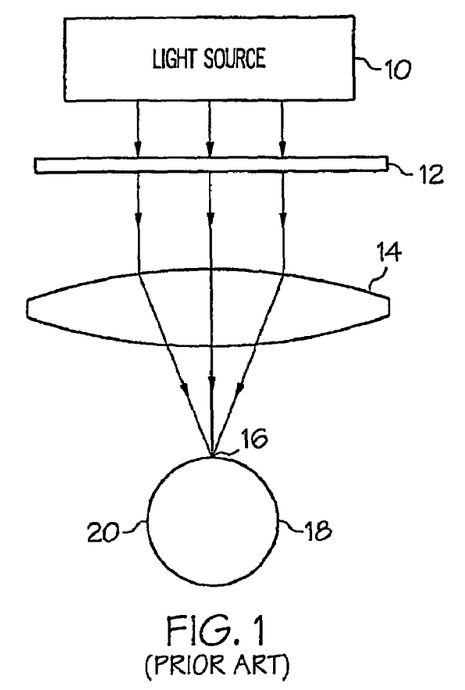
FIG. 1 is a semiconductor light exposure system as found in the prior art.

For example, as shown in prior art FIG. 1, a light from light source 10 is incident to mask 12. Mask 12 projects a pattern or image by the transmitted and non-transmitted portions of the light through mask 12, which is then focused by lens 14 to a focal point 16 on the surface of semiconductor ball 18. The spherical shape of semiconductor ball 18 causes the pattern to blur or distort and become larger in the radial direction from focal point 16. The portion of the pattern or image at point 20 will have less sharpness and clarity and more distortion as compared to the portion of the pattern at focal point 16. The distortion in the pattern at point 20 reduces the accuracy of the pattern and can cause defects in the devices formed on semiconductor ball 18 at or near point 20.

One solution is to reduce the pattern size relative to the surface area of semiconductor ball 18 and thereby reduce the distortion effects. However, such a solution requires more total exposures to cover the required surface area and possible re-alignment of semiconductor ball 18 for each exposure, adding the manufacturing processing time.

In another prior art approach, such as disclosed in U.S. Pat. Nos. 6,097,472 and 6,245,630, the semiconductor ball is positioned within an elliptical shaped mirror. A light source is directed to the elliptical mirror which reflects the light to focal points on the surface of the semiconductor ball as determined by the shape of the inner surface of the mirror and the direction of the incident light.

In order to achieve the desired results, the elliptical shaped mirror must be manufactured to precise specifications. The semiconductor ball must be properly positioned and carefully aligned within the mirror to receive the intended exposure. Using available techniques, it is difficult to maneuver the semiconductor ball to achieve such alignment precision. In addition, the geometries of the elliptical mirror do not lend themselves to semiconductor balls that are not perfect spheres or to curved surfaces other than spheres. The accuracy, complexity, and expense of the mirror and the difficulty in positioning and aligning the semiconductor ball and non-spherical objects are significant drawbacks to the prior art approach.

A need exists for an optical exposure system that allows light to be uniformly exposed across the surface area of a curved object.

DETAILED DESCRIPTION OF THE DRAWINGS

Figure 2:
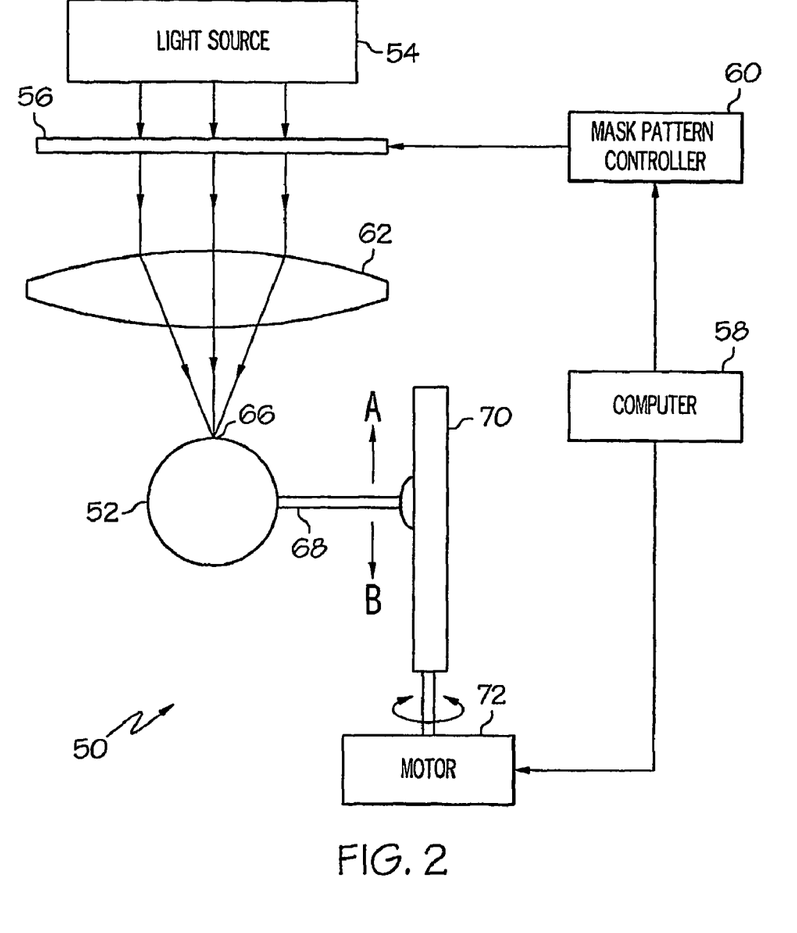
FIG. 2 is a semiconductor manufacturing system for selectively exposing light on the semiconductor ball.

A semiconductor manufacturing system or station 50 is shown in FIG. 2 for exposing light on a spherical semiconductor device or ball 52, or other spherical shaped object, or object having a curved surface. Semiconductor ball 52 may contain active semiconductor devices, such as transistors and diodes, and passive devices, such as resistors and capacitors, over any part or substantially all of its surface area. The manufacture of semiconductor ball 52 is disclosed in U.S. Pat. No. 5,955,776 and incorporated herein by reference. Semiconductor ball 52 has the ability to interconnect to a printed circuit board, or to other semiconductor balls, at virtually any location on its surface, which reduces and simplifies the interconnect layout. The flexible interconnect allows for three dimensional clustering of the semiconductor balls each having multiple active layers and multiple metal layers in any direction. The spherical shape of semiconductor ball 52 provides a structural strength and integrity such that conventional assembly and packaging become unnecessary in some applications.

Semiconductor ball 52 undergoes a variety of thermal, chemical, and physical processes, including diffusion, oxidation, epitaxial growth, ion implantation, deposition, etching, sputtering, polishing, and cleaning, during manufacturing to form the active semiconductor devices and passive devices on its surface. Several of the manufacturing process steps noted above involve exposure of semiconductor ball 52 to a light source. One such manufacturing step is an etching process wherein a photoresist layer is applied to a portion of the surface of semiconductor ball 52. Certain areas of the photoresist layer are exposed to a light source, while other areas of the photoresist layer are not exposed to the light source, as determined by a mask filter. The photoresist material that is exposed to the light source is polymerized. After developing the photoresist material to remove the non-polymerized photoresist, a solution of nitric and HF acid is applied to remove the material which had been underlying the non-polymerized photoresist. The polymerized photoresist and underlying material remain.

Semiconductor manufacturing station 50 represents semiconductor-manufacturing equipment capable of emitting light on semiconductor ball 52 for the above-described manufacturing process and other semiconductor manufacturing steps requiring an exposure to a light source. A light source 54 generates a light from a high-pressure mercury lamp. The light from light source 54 is incident to mask pattern generator 56. Computer 58 stores the desired mask pattern or image that is to be exposed on semiconductor ball 52. The mask pattern defines those areas on the surface of semiconductor ball 52 which are to be exposed to light and those areas, which are not to be exposed to light. The mask pattern can have many sizes, shapes, patterns, and details depending on the desired devices to be formed and disposed on the surface of semiconductor ball 52.

Mask pattern controller 60 receives commands from computer 58 according to the desired mask pattern. Mask pattern generator 56, which can be implemented as a digital mirror device (DMD), receives control signals from computer 58 to program the mask pattern. Further description of mask pattern generator 56 is disclosed in U.S. Pat. No. 6,251,550 and incorporated herein by reference. In the present example, mask pattern generator 56 includes a matrix of 600×600 individually controlled mirrors, each approximately 10 mm×10 mm. Mask pattern controller 60 converts to the desired mask pattern received from computer 58 to a series of control signals sent to each mirror of mask pattern generator 56 to individually program its angle and orientation. Thus, certain mirrors of mask pattern generator 56 are tilted to transmit light to lens 62 for those areas, which are intended to be exposed to light according to the mask pattern. The light image from mask pattern generator 56 passes through lens 62, which focuses the light image on the surface of semiconductor ball 52 centered at focal point 66. In an alternate embodiment, a transmission-type liquid crystal display may be used to emit or transmit light according to the desired mask pattern.

Computer 58 is capable of storing multiple mask patterns. Mask pattern controller 60 can readily re-configure mask pattern generator 56 according to the desired mask pattern.

Semiconductor ball 52 is attached to moveable arm 68 by a suction cup or other attachment mechanism. Arm 68 is connected to travel assembly 70, which provides movement of arm 68 in the vertical direction relative to the plane of FIG. 2 as shown. Computer 58 provides control signals to motor 72, which generates rotational torque along a shaft coupled to travel assembly 70 to move arm 68 using for example a worm gear drive. If travel assembly 70 moves arm 68 in direction A, then semiconductor ball 52 moves closer to lens 62 to alter the relative distance between them. If travel assembly 70 moves arm 68 in direction B, then semiconductor ball 52 moves farther from lens 62, which also alters the relative distance between them.

The exposure process comprises a series of steps or stages. For each step, semiconductor ball 52 is moved incrementally closer to lens 62 so that the focal point of the mask pattern is effectively at different points in the interior of the sphere. By shifting or altering the effective focal point of the mask pattern within the interior of semiconductor ball 52, a series of contour lines defining concentric circles or rings are formed on the surface of the sphere, with a center as focal point 66 shown in FIG. 2.

Figure 3A:
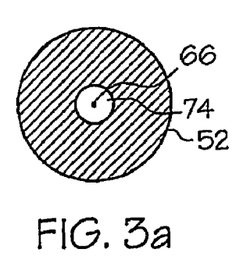
FIGS. 3a–3d illustrate a top view of the semiconductor ball with concentric contour lines and exposure rings.

The contour lines and concentric circles and rings are shown in FIGS. 3*a*–3*d*. FIGS. 3*a*–3*d* each illustrate a top view of semiconductor ball 52 where the direction of the light is normal to the plane of the figure. FIG. 3*a* illustrates semiconductor ball 52 as shown in FIG. 2 with the mask pattern focused at focal point 66 on the surface of semiconductor ball 52. Exposure ring or circle 74 defines that portion of the surface of semiconductor ball 12 that can be exposed, without any appreciable distortion or degradation in the mask pattern, when lens 62 is focused on focal point 66. Computer 58 generates only a portion of the overall mask pattern corresponding to the exposable surface area of semiconductor ball 52 within exposure ring 74. Mask pattern controller 60 sets up mask pattern generator 56 to transmit the light to lens 62 according to that portion of the overall mask pattern that falls within exposure ring 74. The portion of the surface area of semiconductor ball 52 within exposure ring 74 is exposed to light as defined by the transmitted mask pattern. The exposed image within exposure ring 74 is sharp and clear without any appreciable distortion or degradation.

Figure 3B:
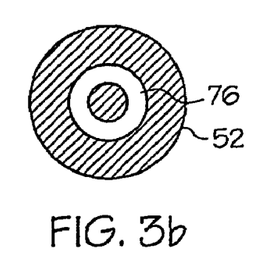

Computer 58 sends a control signal to motor 72 to rotate the worm gear drive in travel assembly 70 and move arm 68 in the direction A. Semiconductor ball 52 moves closer to lens 62 to alter the relative distance between them. The focal point of lens 62 is now at a first interior focal point (not shown) within the interior of semiconductor ball 52. FIG. 3*b* illustrates a top view of semiconductor ball 52 with the mask pattern focused at the first interior focal point. Exposure ring 76 defines that portion of the surface area of semiconductor ball 12 that can be exposed, without any appreciable distortion or degradation in the mask pattern, when lens 62 is focused on the first interior focal point. The inner boundary of exposure ring 76 borders the outer boundary of exposure ring 74. Computer 58 generates only a portion of the overall mask pattern corresponding to the exposable surface area of semiconductor ball 52 within exposure ring 76. Mask pattern controller 60 sets up mask pattern generator 56 to transmit the light to lens 62 according to that portion of the overall mask pattern that falls within exposure ring 76. The portion of the surface area of semiconductor ball 52 within exposure ring 76 is exposed to light as defined by the transmitted mask pattern. The exposed image within exposure ring 76 is sharp and clear without any appreciable distortion or degradation.

Figure 3C:
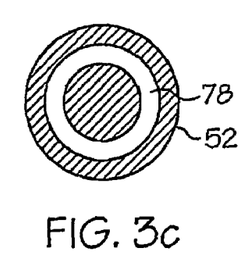

Computer 58 sends another control signal to motor 72 to again rotate the worm gear drive in travel assembly 70 and move arm 68 in the direction A. Semiconductor ball 52 moves even closer to lens 62 to again alter the relative distance between them. The focal point of lens 62 is now at a second interior focal point (not shown) within the interior of semiconductor ball 52. FIG. 3*c* illustrates a top view of semiconductor ball 52 with the mask pattern focused at the second interior focal point. Exposure ring 78 defines that portion of the surface area of semiconductor ball 12 that can be exposed, without any appreciable distortion or degradation in the mask pattern, when lens 62 is focused on the second interior focal point. The inner boundary of exposure ring 78 borders the outer boundary of exposure ring 76. Computer 58 generates only a portion of the overall mask pattern corresponding to the exposable surface area of semiconductor ball 52 within exposure ring 78. Mask pattern controller 60 sets up mask pattern generator 56 to transmit the light to lens 62 according to that portion of the overall mask pattern that falls within exposure ring 78. The portion of the surface area of semiconductor ball 52 within exposure ring 78 is exposed to light as defined by the transmitted mask pattern. The exposed image within exposure ring 78 is sharp and clear without any appreciable distortion or degradation.

Figure 3D:
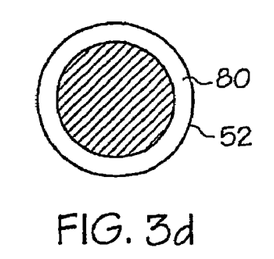

Computer 58 sends yet another control signal to motor 72 to rotate the worm gear drive in travel assembly 70 and move arm 68 in the direction A. Semiconductor ball 52 moves yet closer to lens 62 again altering the relative distance between them. The focal point of lens 62 is now at a third interior focal point (not shown) within the interior of semiconductor ball 52. FIG. 3*d* illustrates a top view of semiconductor ball 52 with the mask pattern focused at the third interior focal point. Exposure ring 80 defines that portion of the surface area of semiconductor ball 12 that can be exposed, without any appreciable distortion or degradation in the mask pattern, when lens 62 is focused on the third interior focal point. The inner boundary of exposure ring 80 borders the outer boundary of exposure ring 78. Computer 58 generates only a portion of the overall mask pattern corresponding to the exposable surface area of semiconductor ball 52 within exposure ring 80. Mask pattern controller 60 sets up mask pattern generator 56 to transmit the light to lens 62 according to that portion of the overall mask pattern that falls within exposure ring 80. The portion of the surface area of semiconductor ball 52 within exposure ring 80 is exposed to light as defined by the transmitted mask pattern. The exposed image within exposure ring 80 is sharp and clear without any appreciable distortion or degradation.

The four exposure rings described above for FIGS. 3*a*-3*d* each cover a surface area of semiconductor ball 52. The focal point of lens 62 and the portion of the overall mask pattern configured for mask pattern generator 56 is selected so that each exposure ring provides a distortion-free image of the mask pattern on the surface of semiconductor ball 52 within the respective exposure ring. The combination of the four exposure rings covers a major portion of the total surface area of semiconductor ball 52, for example, the top half of the sphere. For further coverage, semiconductor ball 52 is rotated 180 degrees and the exposure process is repeated to cover the bottom half of the sphere. The exposure process may be applied to smaller areas as well.

Figure 4:
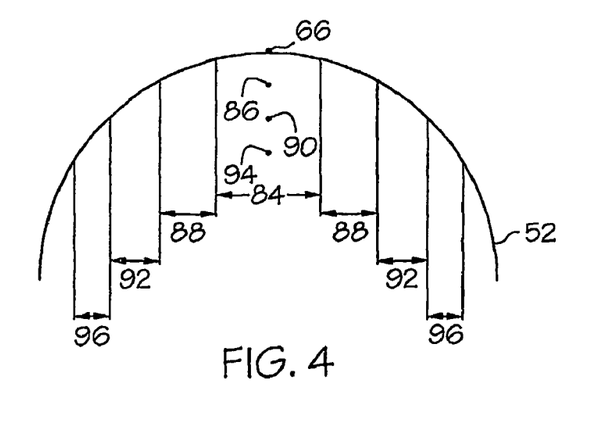
FIG. 4 is a partial cross-sectional view of the semiconductor ball receiving various focal points.

Turning to FIG. 4, a cross-sectional view of a portion of semiconductor ball 52 is shown. For the first exposure, lens 62 is focused on focal point 66 located on the top surface of semiconductor ball 52. The exposable area on the surface of semiconductor ball 52, without any appreciable distortion or degradation, is defined by exposure ring 74 in FIG. 3*a* and identified by boundary lines 84.

For the second exposure, travel assembly 70 and arm 68 as described above move semiconductor ball 52 for FIG. 2. The focal point shifts to the interior of semiconductor ball 52 at focal point 86, which is about 3–5 microns below the surface of semiconductor ball 52. Lens 62 is focused on focal point 86. The exposable area on the surface of semiconductor ball 52, without any appreciable distortion or degradation, is defined by exposure ring 76 in FIG. 3*b* and identified by boundary lines 88.

For the third exposure, travel assembly 70 and arm 68 as described above move semiconductor ball 52 for FIG. 2. The focal point shifts to the interior of semiconductor ball 52 at focal point 90, which is about 3–5 microns below focal point 86. Lens 62 is focused on focal point 90. The exposable area on the surface of semiconductor ball 52, without any appreciable distortion or degradation, is defined by exposure ring 78 in FIG. 3*c* and identified by boundary lines 92.

For the fourth exposure, travel assembly 70 and arm 68 as described above move semiconductor ball 52 for FIG. 2. The focal point shifts to the interior of semiconductor ball 52 at focal point 94, which is about 3–5 microns below focal point 90. Lens 62 is focused on focal point 94. The exposable area on the surface of semiconductor ball 52, without any appreciable distortion or degradation, is defined by exposure ring 80 in FIG. 3*d* and identified by boundary lines 96.

Although the present embodiment discloses four concentric circles and rings defining four exposure divisions, the number of exposure divisions may vary depending upon the size of semiconductor ball 52 and the resolution of mask pattern generator 56 and lens 62. The width of each concentric exposure ring can be made equal or can be varied to allow for ranges of integration density and resolution over the surface of semiconductor ball 52. High-density circuits can be assigned to low width, high-resolution exposure rings, while low-density circuits are assigned to higher width, lower resolution exposure rings. The distortion or degradation in the mask pattern can be further decreased by selecting smaller increments in focal point depth and increasing the number of exposure divisions.

The movement of travel assembly 70 and arm 68 changes the relative focal distance between semiconductor ball 52 and lens 62 and the corresponding focal point of the light exposure. It is the relative focal distance between semiconductor ball 52 and lens 62 and focal point of the light exposure that controls the exposure. Consequently, another approach is to keep semiconductor ball 52 fixed and move lens 62. Thus, lens 62 can be attached to an arm like 68 to change the relative distance between semiconductor ball 52 and lens 62 and the focal point of the light exposure. Also, lens 62 can be fixed and made to have an adjustable focal length.

Figure 5:
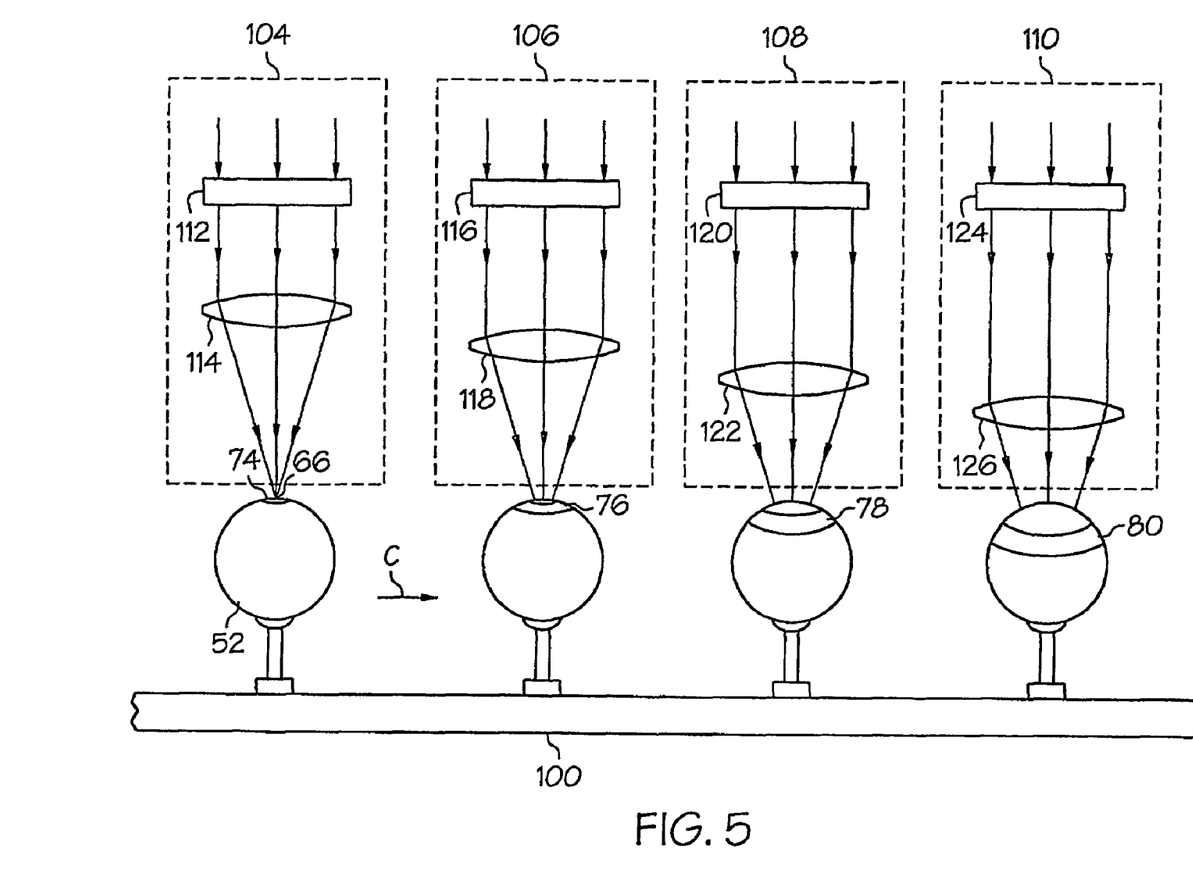
FIG. 5 is an alternate embodiment of the semiconductor manufacturing system for selectively exposing light on the semiconductor ball.

Yet another embodiment of the semiconductor manufacturing system is shown in FIG. 5. A transport conduit or conveyor assembly 100 moves semiconductor ball 52 in direction C in proximity to optical stations 104, 106, 108, and 110. Semiconductor ball 52 first passes under or in proximity to optical station 104, which includes a mask pattern generator 112 to generate a portion of the overall mask pattern similar to exposure ring 74 as described in FIG. 3*a*. The relative focal distance between lens 112 and semiconductor ball 52 in optical station 104 is set, or the optical properties of lens 112 are such, so as to focus the partial mask pattern on the surface of semiconductor ball 52 centered at focal point 66. As semiconductor ball 52 passes under optical station 104, its surface is exposed to a light corresponding to the partial mask pattern defined by exposure ring 74.

As the second step or stage in the sequence, semiconductor ball 52 passes under or in proximity to optical station 106, which includes a mask pattern generator 116 to generate a portion of the overall mask pattern similar to exposure ring 76 as described in FIG. 3*b*. The relative focal distance between lens 118 and semiconductor ball 52 in optical station 106 is set, or the optical properties of lens 118 are such, so as to focus the partial mask pattern on the surface of semiconductor ball 52 centered at a first interior focal point similar to focal point 86 in FIG. 4. As semiconductor ball 52 passes under optical station 106, its surface is exposed to a light according to the partial mask pattern defined by exposure ring 76.

As the third step or stage in the sequence, semiconductor ball 52 passes under or in proximity to optical station 108, which includes a mask pattern generator 120 to generate a portion of the overall mask pattern similar to exposure ring 78 as described in FIG. 3*c*. The relative focal distance between lens 122 and semiconductor ball 52 in optical station 108 is set, or the optical properties of lens 122 are such, so as to focus the partial mask pattern on the surface of semiconductor ball 52 centered at a third interior focal point similar to focal point 90 in FIG. 4. As semiconductor ball 52 passes under optical station 108, its surface is exposed to a light corresponding to the partial mask pattern defined by exposure ring 78.

As the fourth step or stage in the sequence, semiconductor ball 52 passes under or in proximity to optical station 110, which includes a mask pattern generator 124 to generate a portion of the overall mask pattern similar to exposure ring 80 as described in FIG. 3*d*. The relative focal distance between lens 126 and semiconductor ball 52 in optical station 106 is set, or the optical properties of lens 126 are such, so as to focus the partial mask pattern on the surface of semiconductor ball 52 centered at a third interior focal point similar to focal point 94 in FIG. 4. As semiconductor ball 52 passes under optical station 110, its surface is exposed to a light corresponding to the partial mask pattern defined by exposure ring 80.

Thus, after passing in proximity to optical stations 104–110, the upper portion of semiconductor ball 52 has been exposed to light as defined by the overall mask pattern albeit in four stages. Each stage is directed to a surface area of semiconductor ball 52, i.e. corresponding to exposure rings 74, 76, 78, and 80. The combination of the four exposure rings during the four stages provides coverage over a major portion of the total surface area of semiconductor ball 52, for example, the top half of the sphere. The overall exposed mask pattern image is sharp and clear without any appreciable distortion or degradation.

The embodiment of the semiconductor manufacturing system as shown in FIG. 5 offers certain efficiencies. Although each mask pattern generator is configurable, each can be set and dedicated to a portion of the overall mask pattern during the manufacturing process so that the mask pattern generators do not have to be re-configured at each exposure. The optical stations 104–110 allow for a different semiconductor ball to be resident at each optical station at any given time whereby multiple semiconductor balls can be undergoing exposure simultaneously, each at a different stage in the process. The continuous process improves productivity and throughput.

In summary, the light exposure to the semiconductor ball is performed by dividing the mask pattern into a plurality of concentric rings each having a different focal point and exposable area on the surface of the semiconductor ball. The exposure division process can cover a wide area by dividing the mask pattern with contour lines defining concentric circles and rings. By dividing the surface area into a plurality of concentric rings and exposing each ring individually, substantially the entire surface area of the semiconductor ball or other curved object can be exposed to a light source without distortion or degradation of the mask pattern image. The exposure division process works with spheres and other objects with complex curved surfaces and curved surfaces combined with planar surfaces.

By expanding on the same principal to extremely small ring widths, it is possible to expose the surface divisions to light in a substantially continuous mode. The focal points can exist at substantially all depths within the semiconductor ball and high quality exposures become possible.

Although the present invention has been described with respect to preferred embodiments, any person skilled in the art will recognize that changes may be that changes be made in form and detail, and equivalents may be substituted for elements of the invention without departing from the spirit and scope of the invention. Many modifications may be made to adapt to a particular situation or material to the teaching of the invention without departing from the essential scope of the invention. Therefore, it is intended that the invention not be limited to the particular embodiments disclosed for carrying out this invention, but that the invention will include all embodiments falling within the scope of the appended claims.

What is claimed is:

1. An optical apparatus for exposing light on a surface area of an object having a curvature, comprising:
    a mask adapted for receiving the light and passing the light to the surface area of the object, wherein a pattern of the mask comprises a first ring and a first local distance is made between the lens and the object to expose the first ring on a first surface area of the object; and
    a lens positioned between the mask and the object such that a focal distance between the lens and the object is variable to expose the light passed by the mask on surface areas of the object.

2. The optical apparatus of claim 1, wherein the object is a spherical object.

3. The optical apparatus of claim 2, wherein the spherical object is a semiconductor device.

4. The optical apparatus of claim 1, wherein the pattern of the mask comprises a second ring and a second focal distance is made between the lens and the object less than the first focal distance to expose the second ring on a second surface area of the object.

5. The optical apparatus of claim 1, further including:
    a motor coupled for receiving a control signal;
    a travel assembly coupled to a shaft of the motor; and
    a moveable arm having a first end coupled to the travel assembly and a second end coupled to the object for moving the object relative to the lens.

6. The optical apparatus of claim 1, wherein the mask includes:
    a mask pattern generator having a plurality of mirrors which are configurable; and
    a mask pattern controller operating in response to control signals and providing a mask pattern to the mask pattern generator to configure the plurality of mirrors.

7. The optical apparatus of claim 6, wherein the mask pattern generator comprises a digital mirror device.

8. A method of exposing light on a surface area of an object having a curvature, comprising:
    passing light according to a pattern of a mask;
    directing the light passed by the pattern of the mask though a lens to the surface area of the object;
    altering a focal distance between the lens and the object to expose the light passed by the pattern of the mask on surface areas of the object;
    providing a first ring for the pattern of the mask; and
    programming a first focal distance between the lens and the object to expose the first ring on a first surface area of the object.

9. The method of claim 8, wherein the object is a spherical semiconductor device.

10. The method of claim 8, further including:
    providing a second ring for the pattern of the mask; and
    programming a second focal distance between the lens and the object to expose the second ring on a second surface area of the object.

11. The method of claim 10, further including moving the object relative Lo the lens to set the first and second focal distances between the lens and the object.

12. An optical apparatus for exposing light on a surface area of an object having a curvature, comprising:
    first and second optical stations each including,
        (a) a mask adapted for receiving light and passing the light to the object in accordance with a pattern of the mask, wherein the pattern of the mask of the first optical station comprises a first ring, and
        (b) a lens positioned at a focal, distance between the mask and the object, wherein the object passes in proximity to the first optical station to expose the light passed by the mask of the first optical station on a first surface area of the object and the object passes in proximity to the second optical station to expose the light passed by the mask of the second optical station on a second surface area of the object.

13. The optical apparatus of claim 12, wherein the object is a spherical object.

14. The optical apparatus of claim 13, wherein the spherical object is a semiconductor device.

15. The optical apparatus of claim 12, wherein the pattern of the mask of the second optical station comprises a second ring.

16. The optical apparatus of claim 12, wherein a first object is proximate to the first optical station while a second object is proximate to the second optical station.

17. A method of exposing light on a surface area of an object having a curvature, comprising:
    passing the object in proximity to a first optical station to expose light on a first surface area of the object according to a pattern of a first mask, wherein the pattern of the first mask comprises a first ring; and
    passing the object in proximity to a second optical station to expose light on a second surface area of the object according to a pattern of a second mask.

18. The method of claim 17, wherein the object is a spherical semiconductor device.

19. The method of claim 17, wherein the pattern of the second mask comprises a second ring.

20. The method of claim 17, wherein a first object is proximate to the first optical station while a second object is proximate to the second optical station.

21. A method of manufacturing a semiconductor device, comprising:
    passing light according to a pattern of a mask;
    directing the light passed by the pattern of the mask though a lens to the surface area of the semiconductor device;
    altering a focal distance between the lens and the semiconductor device to expose the light passed by the pattern of the mask on surface areas of the semiconductor device;
    providing a first ring for the pattern of the mask; and
    setting a first focal distance between the lens and the semiconductor device to expose the first ring on a first surface area of the semiconductor device.

22. The method of claim 21, wherein the semiconductor device is a spherical semiconductor device.

23. The method of claim 21, further including:
    providing a second ring for the pattern of the mask; and
    setting a second focal distance between the lens and the semiconductor device to expose the second ring on a second surface area of the semiconductor device.

24. The method of claim 23, further including moving the semiconductor device relative to the lens to set the first and second focal distances between the lens and the semiconductor device.

25. A method of manufacturing a semiconductor device, comprising:
- passing the semiconductor device in proximity to a first optical station to expose light on a first surface area of the semiconductor device according to a pattern of a first mask, wherein the pattern of the first mask comprises a first ring; and
- passing the semiconductor device in proximity to a second optical station to expose light on a second surface area of the semiconductor device according to a pattern of a second mask.

26. The method of claim 25, wherein the semiconductor device is a spherical semiconductor device.

27. The method of claim 25, wherein the pattern of the second mask comprises a second ring.

28. The method of claim 25, wherein a first semiconductor device is proximate to the first optical station while a second semiconductor device is proximate to the second optical station.

29. A method of exposing light on a surface area of an object having a curvature, comprising:
- dividing a mask along a contour line into a plurality of rings;
- passing light according to a pattern of the mask;
- directing the light passed by the pattern of the mask through a lens to the surface area of the object; and
- altering a focal distance between the lens and the object to expose the light passed by the pattern of the mask on surface areas of the object.

30. The method of claim 29, wherein the semiconductor device is a spherical semiconductor device.

* * * * *